United States Patent
Van Zeijl et al.

(10) Patent No.: US 9,614,277 B2
(45) Date of Patent: Apr. 4, 2017

(54) RADIOFREQUENCY MODULE

(71) Applicant: OMNIRADAR BV, Maarssen (NL)

(72) Inventors: Paulus Thomas Maria Van Zeijl, Eindhoven (NL); Hans Brouwer, Eindhoven (NL); Jacques Leopold Catharina Rompen, Eindhoven (NL)

(73) Assignee: OMNIRADAR BV, Eindhoven (NL)

( * ) Notice: Subject to any disclaimer, the term of this patent is extended or adjusted under 35 U.S.C. 154(b) by 81 days.

(21) Appl. No.: 14/431,211

(22) PCT Filed: Sep. 26, 2013

(86) PCT No.: PCT/EP2013/070128
§ 371 (c)(1),
(2) Date: Mar. 25, 2015

(87) PCT Pub. No.: WO2014/049088
PCT Pub. Date: Apr. 3, 2014

(65) Prior Publication Data
US 2015/0222012 A1     Aug. 6, 2015

Related U.S. Application Data

(60) Provisional application No. 61/705,646, filed on Sep. 26, 2012.

(51) Int. Cl.
| | | |
|---|---|---|
| *H01Q 1/48* | (2006.01) |
| *G01S 7/03* | (2006.01) |
| *H01Q 1/22* | (2006.01) |
| *H01Q 1/38* | (2006.01) |
| *H01Q 1/42* | (2006.01) |
| *H01Q 15/08* | (2006.01) |
| *H01Q 19/06* | (2006.01) |
| *H01Q 19/10* | (2006.01) |
| *H01Q 21/00* | (2006.01) |
| *H01Q 21/06* | (2006.01) |

(52) U.S. Cl.
CPC .............. *H01Q 1/48* (2013.01); *G01S 7/032* (2013.01); *H01Q 1/2283* (2013.01); *H01Q 1/38* (2013.01);
(Continued)

(58) Field of Classification Search
CPC .................................. H01Q 1/48; H01Q 1/38
(Continued)

(56) References Cited

U.S. PATENT DOCUMENTS

| | | | | |
|---|---|---|---|---|
| 6,693,593 B1 * | 2/2004 | Burgess | .................. | H01P 1/047 343/700 MS |
| 7,982,684 B2 * | 7/2011 | O'Connell | ............... | H01Q 1/38 343/872 |

(Continued)

FOREIGN PATENT DOCUMENTS

| | | |
|---|---|---|
| DE | 102009026475 A1 | 12/2010 |
| EP | 1357395 A1 | 10/2003 |

OTHER PUBLICATIONS

International Search Report dated Dec. 9, 2013, for International Patent Application No. PCT/EP2013/070128.
(Continued)

*Primary Examiner* — Huedung Mancuso
(74) *Attorney, Agent, or Firm* — Karceski IP Law, PLLC

(57) ABSTRACT

A radio frequency module comprises an antenna assembly on a semiconductor integrated circuit that can transmit an electromagnetic signal in a frequency band of interest, or receive an electromagnetic signal in a frequency band of interest, or both. In the radio frequency module, a conductive layer that forms a signal ground plane. At least one semiconductor layer of the semiconductor integrated circuit forms part of this dielectric spacing. The dielectric spacing is arranged so that an electromagnetic signal in the frequency band of interest that traverses through the dielectric spacing from the antenna assembly to the conductive layer that forms the signal ground plane experiences a phase shift comprised in the range between 60 and 120 degrees.

11 Claims, 2 Drawing Sheets

(52) U.S. Cl.
CPC ............... *H01Q 1/42* (2013.01); *H01Q 15/08* (2013.01); *H01Q 19/06* (2013.01); *H01Q 19/10* (2013.01); *H01Q 21/0093* (2013.01); *H01Q 21/061* (2013.01)

(58) Field of Classification Search
USPC .......................... 300/860, 702, 700 MS, 872
See application file for complete search history.

(56) References Cited

U.S. PATENT DOCUMENTS

| | | | |
|---|---|---|---|
| 8,407,890 B2* | 4/2013 | Tang | H01Q 1/2283 29/592.1 |
| 8,508,422 B2* | 8/2013 | Rofougaran | H01Q 1/248 343/700 MS |
| 9,329,261 B2* | 5/2016 | Rofougaran | G01S 13/06 |
| 2008/0278400 A1 | 11/2008 | Lohninger | |
| 2010/0033395 A1 | 2/2010 | Ding et al. | |
| 2012/0154238 A1 | 6/2012 | Carpentier et al. | |

OTHER PUBLICATIONS

Rogers Corporation Data Sheet, RO 4000 Series High Frequency Circuit Materials, Publication No. 92-004, Apr. 2006.
Rogers Corporation Data Sheet, RO 4000 Series High Frequency Circuit Materials, Publication No. 92-004, Jan. 2011.
Sumitomo Bakelite Co., Ltd., Safety Data Sheet, Product EME-G770H, Type CD, Epoxy Molding Compound, May 8, 2007.

* cited by examiner

RADIOFREQUENCY MODULE

CROSS-REFERENCE TO RELATED APPLICATION(S)

This is a National Stage Entry into the United States Patent and Trademark Office from International PCT Patent Application No. PCT/EP2013/070128, having an international filing date of Sep. 26, 2013, which claims priority to U.S. Provisional Patent Application No. 61/705,646, filed Sep. 26, 2012, the entire contents of both of which are incorporated herein by reference.

FIELD OF THE INVENTION

An aspect of the invention relates to a radiofrequency module. The radiofrequency module may be arranged to carry out, for example, radar detection. The radiofrequency module may be adapted for, for example, surface mounting on a printed circuit board.

BACKGROUND OF THE INVENTION

A radiofrequency module may comprise a semiconductor integrated circuit that can transmit an electromagnetic signal, or that can receive an electromagnetic signal, or both. To that end, an antenna assembly may be disposed on the semiconductor integrated circuit. Such a compact structure can be used, in particular, when the electromagnetic signal is in the millimeter wave range.

Patent publication US 2008/0278400 A1 describes an electronic apparatus comprising an antenna chip and a package. The package comprises a chip mounting surface and an encapsulating material. The antenna chip comprises a substrate, in particular silicon substrate, and an antenna structure. A void is arranged in the substrate in the vicinity of the antenna structure. This void is produced by etching. The void in the substrate, which is in the vicinity of the antenna structure, serves to improve antenna emission characteristics.

Patent publication US 2010/0033395 A1 describes a semiconductor chip integrating a transceiver, an antenna, and a receiver. The antenna connected to the transceiver is located in a dielectric layer located on the front side of the substrate. The separation between the reflector plate and the antenna is about the quarter wavelength of millimeter waves, which enhances radiation efficiency of the antenna. An array of through substrate dielectric vias is employed to reduce the effective dielectric constant of the material between the antenna and the reflector plate, thereby reducing the wavelength of the millimeter wave and enhance the radiation efficiency.

SUMMARY OF THE INVENTION

There is a need for a solution that allows providing radiofrequency modules having a satisfactory performance at relatively low cost.

In order to better address this need, in accordance with an aspect of the invention, there is provided a radiofrequency module comprising:

an antenna assembly on a semiconductor integrated circuit arranged to carry out at least one of the following functions: transmitting an electromagnetic signal in a frequency band of interest, and receiving a electromagnetic signal in the frequency band of interest;

a conductive layer that forms a signal ground plane; and a dielectric spacing between the antenna assembly and the conductive layer that forms the signal ground plane, the dielectric spacing comprising:

at least one semiconductor layer of the semiconductor integrated circuit; and a printed circuit board on which the semiconductor integrated circuit is mounted, the conductive layer that forms the signal ground plane being disposed on a side of the printed circuit board opposite to a side on which the semiconductor integrated circuit is mounted, the dielectric spacing being arranged so that a electromagnetic signal in the frequency band of interest that traverses through the dielectric spacing from the antenna assembly to the conductive layer that forms the signal ground plane experiences a phase shift comprised in a range between 60 and 120 degrees.

In such a radiofrequency module, an electromagnetic signal that is radiated by the antenna assembly will partially enter into a semiconductor substrate of the semiconductor integrated circuit. The signal ground plane serves as a reflector for this semiconductor-absorbed part of the electromagnetic signal. The signal ground plane provides a reflected electromagnetic signal. The dielectric spacing ensures that this reflected electromagnetic signal constructively interferes, as it were, with the radiated electromagnetic signal. That is, the reflected electromagnetic signal adds to the radiated electromagnetic signal, thus increasing electromagnetic energy radiated in a desired direction. A part of the radiated electromagnetic signal that enters into the semiconductor substrate is thus not "lost" as in conventional antenna-on-chip devices but, instead, can contribute to efficient transmission or reception, or both.

The radiofrequency module as defined hereinbefore presents several advantages with respect to the electronic apparatus proposed by the first of the aforementioned patent publications. In particular, in the radiofrequency module as defined hereinbefore, the semiconductor integrated circuit need not be provided with a void as described in the aforementioned patent application. Consequently, there is no need for an additional etching step for forming this void. Manufacturing is easier and therefore cheaper. Manufacturing is also easier and therefore cheaper with respect to the second of the aforementioned patent publications.

Moreover, the void as proposed in the first of the aforementioned patent publication makes that the semiconductor integrated circuit with this void is relatively fragile. There is a risk that the semiconductor integrated circuit is damaged when a covering layer is disposed on the semiconductor integrated circuit. The semiconductor integrated circuit may break at such a point in a manufacturing process. In contrast, there is relatively little risk that the semiconductor integrated circuit is damaged during a manufacturing process of the radiofrequency module as defined hereinbefore.

An embodiment of the invention advantageously comprises one or more of the following additional features, which are described in separate paragraphs. These additional features each contribute to satisfactory performance at relatively low cost.

The dielectric spacing has an effective dielectric thickness $d_{tot}/\lambda$ that can then be expressed as:

$$\frac{d_{tot}}{\lambda} = \frac{d1}{\lambda}\sqrt{er1} + \frac{d2}{\lambda}\sqrt{er2}$$

d1 representing a thickness of the at least one semiconductor layer of the semiconductor integrated circuit;

d2 representing a thickness of the printed circuit board;

er1 representing a dielectric constant of the at least one semiconductor layer;

er2 representing a dielectric constant of the printed circuit board; and

λ representing a free-space wavelength at a frequency in the frequency band of interest, whereby the thickness d1 and the thickness d2 are such that the effective electric thickness dtot/λ is comprised in a range between 0.22 and 0.28.

The printed circuit board advantageously comprises epoxy material.

The epoxy material is advantageously of a type that is one of the following: FR4, RO4003, and RO4350; RO4003 and RO4350 being trademarks of the Rogers Corporation.

The printed circuit board advantageously comprises at least one conducting via arranged to electrically couple the semiconductor integrated circuit to the conductive layer that forms the signal ground plane.

The radiofrequency module advantageously comprises a covering layer disposed on the antenna assembly.

The covering layer advantageously has a shape such that the covering layer constitutes an electromagnetic lens for an electromagnetic signal in the frequency band of interest.

The covering layer advantageously comprises epoxy material.

The semiconductor integrated circuit may be arranged to carry out radar detection.

The radiofrequency module is advantageously adapted for surface mounting on a main printed circuit board.

For the purpose of illustration, a detailed description of some embodiments of the invention is presented with reference to accompanying drawings.

DETAILED DESCRIPTION

Figure 1:
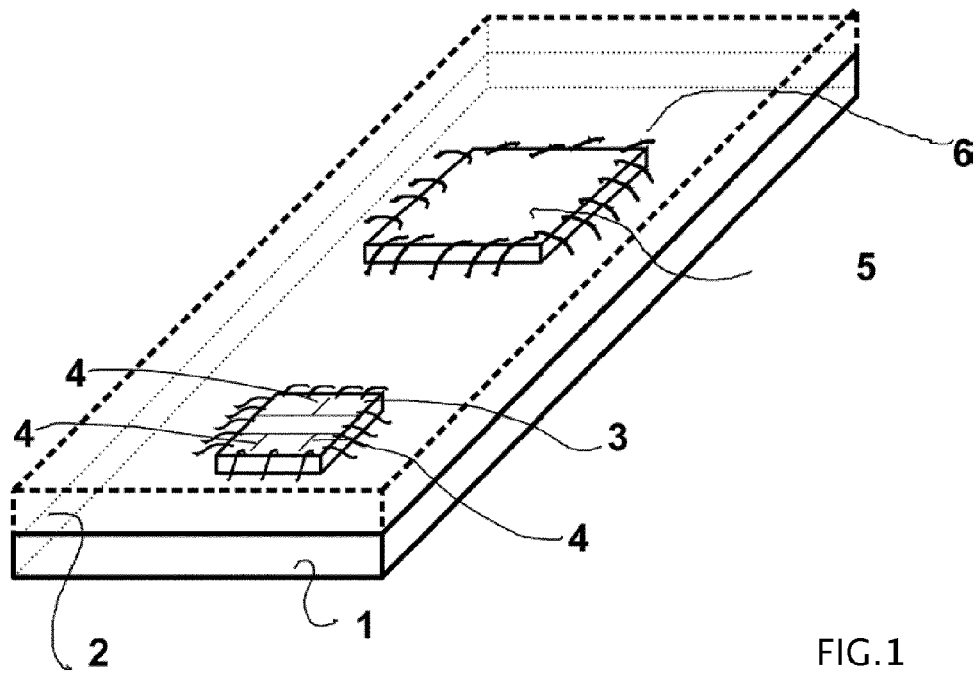
FIG. 1 illustrates a radar module comprising a radar integrated circuit embedded in a package.

FIG. 1 illustrates a radar module comprising a radar integrated circuit (IC) 3 embedded in a package. The radar IC 3 is mounted on a substrate 1 by means of, for example, gluing. The substrate 1 may be printed-circuit-board (PCB)-like and will be referred to hereinafter as PCB 1 for reasons of convenience. The PCB 1 can be of material such as standard FR4-epoxy, or more special materials like RO4003 or RO4350; RO4003 and RO4350 being trademarks of the Rogers Corporation. The radar IC 3 is electrically connected to copper traces on the PCB 1 through multiple bonding wires 6. However, in another embodiment, electrical connections may be provided through bumps and flip chipping the radar IC 3.

Concerning the RO4003 and RO4350 materials, physical characteristics and compositional parameters may be found in one or more publications describing these materials. For example, Rogers Corporation published at least two data sheets on RO4003 and RO4350, which are entitled "RO4000 Series High Frequency Circuit Materials," dated April, 2006 and "RO4000 Series High Frequency Circuit Materials," presumably dated January, 2011, both of which are incorporated herein by reference. These publications list the materials as "glass reinforced hydrocarbon/ceramic laminates" and "hydrocarbon ceramic laminates," respectively.

The radar module further comprises an antenna assembly 4 that is present on the radar IC 3. In FIG. 1, three antennas representing the antenna assembly 4 have been drawn for the sake of simplicity. However, the antenna assembly 4 may comprise a different number of antennas. These on-chip antennas can be connected to active circuitry in the radar IC 3. It is preferred that an area around the antenna assembly 4 is substantially free of conductive material, except for a bottom layer of the PCB 1, as will be explained hereinafter. An advantage of this structure is that it is sufficient to provide low-frequency and digital connections between the radar IC 3 and the PCB 1.

In this example, a further IC 5 is also mounted on the PCB 1. This further IC 5 may be, for example, a micro-controller, a micro-processor, a DSP, an FPGA, or any other type of integrated circuit (DSP is an acronym for Digital Signal Processor; FPGA is an acronym for Field Programmable Gate Array). The further IC 5 is electrically connected to copper tracks on the PCB via bonding wires 6. It should be noted that in other embodiments, multiple radar ICs may be mounted on a single PCB and communicate with one or more further ICs, such as micro-processors.

The PCB 1 with various components mounted thereon, such as the radar IC 3, forms a structure that is covered by a covering layer 2, which may be of epoxy material. This covering layer will hereinafter be referred to as epoxy layer 2 for reasons of convenience. The epoxy layer 2 may cover the complete radar module thus preventing moisture reaching silicon and thus increasing product life-time. An epoxy material like EME-G770H from Sumitomo Bakelite is well suited to form the epoxy layer 2. A material safety data sheet for this epoxy material, entitled "Safety Data Sheet," dated May 8, 2007, incorporated herein by reference, provides details therefor.

The radar IC 3 can carry out radar detection by applying radio-frequency (RF) signals to the antenna assembly 4 and by processing RF signals received from the antenna assembly 4. That is, the radar IC 3 transmits and receives electromagnetic waves via the antenna assembly 4. In an embodiment where these RF signals have a frequency of, for example, 60 GHz, the antenna assembly 4 can be quite small, in the order of millimeters. The radar IC 3 may communicate with the further IC 5 by means of low-frequency signals. The further IC 5 may process data from the radar IC 3 so as to determine, for example, distance to objects, speed of objects and size of objects.

An advantage of the radar module illustrated in FIG. 1 is that users do not have to worry about complex RF behavior, and only have to provide low-frequency analog and/or data signal connections. The radar module can be fully tested and specified so that users can design this module easily into their products with minimum time-time-market. The radar module may be in the form of a surface mount component that can be picked-and-placed in state-of-the-art electronics devices manufacturing processes.

Figure 2:
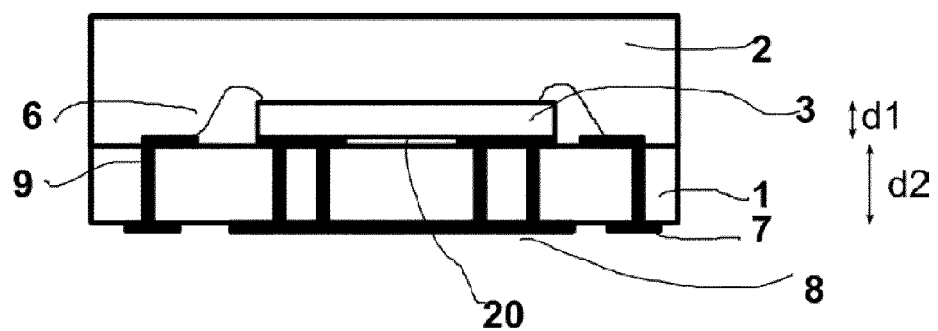
FIG. 2 illustrates a cross-section of the radar module.

FIG. 2 shows a cross-section of the radar module. The radar IC 3 is glued on the PCB 1 and covered by the epoxy layer 2. The bonding wires 6 provide electrical connections. A via 9 may electrically connect a bonding wire 6 from a top-side of the PCB, on which the radar IC 3 is mounted, to a pad 7 on a bottom-side of the PCB 1. Multiple vias beneath the radar IC 3 may be provided so as to connect a bottom-side of the radar IC 3 to a further pad 8 on the bottom-side of the PCB 1. These connections may constitute signal ground connections and may further provide thermal coupling to a heat-sink. The further pad 8 may be a conductive layer that forms a signal ground plane. This pad will therefore be referred to a signal ground plane 8 hereinafter.

The pad 7 and the signal ground plane 8, as well as further pads, can be used to mount the radar module on a motherboard by means of, for example, soldering. Alternatively, the pad 7 and the signal ground plane 8, as well as further pads, can be provided with pins, which may serve as electrical connections to a system of which the radar module forms part. These connections can be used for power supply, ground, data- and programming-interface and other connections to this system.

In general, an antenna on a silicon substrate may also radiate into this substrate. As the silicon substrate is generally lossy, a certain amount of radiated energy will be lost. Moreover, mounting a radar IC provided with an antenna, as illustrated in FIG. 1, on a conductive substrate may result in reflections from this conductive substrate back towards the antenna. A reflection of a radiated signal may have a phase that is opposite to the phase of the radiated signal; the reflection may be 180 degrees out of phase. In that case, the radiated signal may be attenuated to a relatively large degree.

Referring to FIG. 2, this attenuation problem can be alleviated by avoiding a conductive layer between a silicon substrate of the radar IC 3 and PCB 1. For example, in case glue is provided between the silicon substrate of the radar IC 3 and the PCB 1, this glue is preferably non-conducting. That is, an area below the antenna assembly 4 is preferably free of conductive material. In the radiofrequency module illustrated in FIG. 2, there is a gap 20 in a conductive layer on a side of the PCB 1 on which the radar IC 3 is mounted. This gap 20, which is located beneath the antenna assembly 4, may be filled by non conducting glue.

A conductive layer can be provided at a bottom side of the PCB 1 to define the phase of the reflection. A radar module can be designed such that a reflected wave arriving back at an antenna is in phase with a radiated wave from this antenna. The reflected wave constructively interferes, as it were, with the radiated wave from the antenna. In this manner, a reflection increases the magnitude of the radiated wave in a desired direction. A received signal from this direction is also increased in magnitude.

More specifically, in the radar module illustrated in FIGS. 1 and 2, the antennas assembly 4 may be formed in a metal layer in the radar IC 3. This metal layer is present on the silicon substrate of the radar IC 3. The silicon substrate has a thickness d1 as indicated in FIG. 2. The PCB 1 has a thickness as d2 as indicated in FIG. 2. The silicon substrate and the PCB 1 form part of a dielectric spacing between the antenna assembly 4 and the signal ground plane 8. An electromagnetic signal emitted by the antenna assembly 4, or received by the antenna assembly 4, traverses through this dielectric spacing from the antenna assembly 4 to the signal ground plane 8.

A total effective dielectric thickness dtot/λ can be defined as:

$$\frac{d_{tot}}{\lambda} = \frac{d1}{\lambda}\sqrt{er1} + \frac{d2}{\lambda}\sqrt{er2}$$

where d1 and d2 are as mentioned hereinbefore and as illustrated in FIG. 2, er1 representing a dielectric constant of the silicon substrate, er2 representing a dielectric constant of the PCB1, and λ representing a free-space wavelength at a frequency in a frequency band of interest. The frequency band of interest typically covers a frequency range in which the radar IC 3 can transmit and a frequency range in which the radar IC 3 can receive RF signals through the antenna assembly 4.

Satisfactory performance can be obtained when the total effective dielectric thickness dtot/λ is in a range around 0.25, for example, in a range comprised between 0.22 and 0.28. The signal ground plane 8 serves as a reflector for an electromagnetic signal radiated by the antenna assembly 4. A reflected electromagnetic signal constructively interferes, as it were, with this radiated electromagnetic signal. That is, the reflected electromagnetic signal adds to the radiated electromagnetic signal, thus increasing electromagnetic energy radiated in a desired direction, through the epoxy layer 2.

In this respect, it should be noted that the electromagnetic signal emitted by the antenna assembly 4 has an upwardly directed component and a downwardly directed component. The upwardly directed component traverses through the epoxy layer 2 and then reaches free space and, finally, a desired target, if present. The downwardly directed component radiates into the silicon substrate of the radar IC 3, traversing the dielectric spacing. The upwardly directed component of electromagnetic signal emitted by the antenna assembly 4 has a phase that is opposite to that of the downwardly directed component that accounts for the reflected electromagnetic signal. This phase opposition between the upwardly directed component and the downwardly directed component explains the satisfactory performance that can be obtained when the total effective dielectric thickness dtot/λ is in a range around 0.25.

In practice, calculation of total effective dielectric thickness dtot/λ can be more complicated because the radar IC 3 will typically comprises several layers, which may have different dielectric constants. A more precise calculation can take this into account and may then comprise various terms for various layers, whereby a term for a layer comprises a thickness of this layer and a dielectric constant. Such a precise calculation may further take into account a glue layer, having a certain thickness, which is disposed between the radar IC 3 and the PCB 1.

For example, a typical value of d1, the thickness of the silicon substrate, is 0.1 mm; a typical value of d2, the thickness of the PCB1, is 0.5 mm. A typical value of e1, the dielectric constant of the silicon substrate, is 11.9; a typical value of e2, the dielectric constant of the PCB1, is 3.66. With these typical values, the total effective dielectric thickness dtot/λ is 0.26, which is sufficiently close to an optimum value of 0.25. Computer-based simulations with electromagnetic simulators can be used to conceive a radiofrequency module in which the total effective dielectric thickness dtot/λ is closer to the optimum value of 0.25.

More generally, satisfactory performance can be obtained when a dielectric spacing from an on-chip antenna assembly to the signal ground plane is arranged so that an electromagnetic signal in a frequency band of interest that traverses through the dielectric spacing from the antenna assembly to the signal ground plane experiences a phase shift comprised in a range between 60 and 120 degrees. More preferably, this phase shift is comprised in a range between 80 and 100 degrees.

Referring to FIG. 2, in case the thickness d2 of the PCB 1 exceeds a critical value, surface waves may be generated. This should preferably be avoided, because surface waves induce loss. A design effort may be required to find an appropriate thickness of the PCB1.

Figure 3:
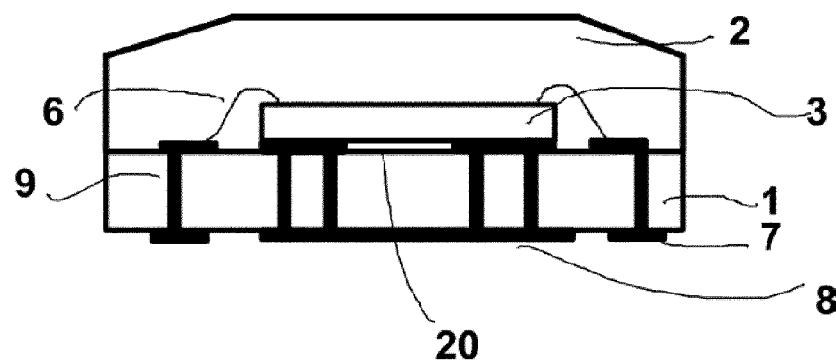
FIG. 3 illustrates a cross-section of an advantageous variant of the radar module.

FIG. 3 shows a cross-section of an advantageous variant of the radar module. The cross-section is similar to that in FIG. 2, except for the following feature. In FIG. 3, the epoxy layer 2 has slanted edges instead of rectangular edges. These slanted edges counter the generation of surface waves in the epoxy layer 2 and may also counter the generation of surface waves in the substrate layer of the radar IC 3. The edges can be rounded off. Numerous shapes are possible, different from that illustrated in FIG. 3. Moreover, this feature of the epoxy layer 2 having slanted edges provides another advantage. These edges can cause the epoxy layer 2 to act as a kind of lens that appropriately focuses energy radiated from the antenna assembly 4.

The advantageous variant illustrated in FIG. 3 thus comprises a feature of a covering layer that constitutes an electromagnetic lens for an electromagnetic signal in the frequency band of interest. It should be noted that, in principle, this feature can be applied to any radiofrequency module that has an antenna assembly and a covering layer disposed on the antenna assembly. That is, this feature does not require the presence of a conductive layer that forms a signal ground plane, nor the presence of a dielectric spacing as described in the present application. What is more, this feature does even not require the antenna assembly to be disposed on a semiconductor integrated circuit. A lens-forming covering layer may be disposed on an antenna assembly that is present on, for example, a printed circuit board.

Figure 4:
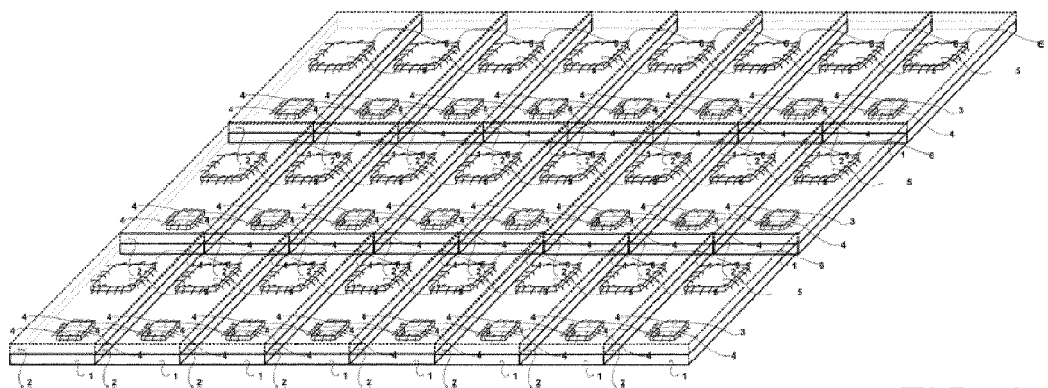
FIG. 4 illustrates a radar assembly comprising a plurality of radar modules.

FIG. 4 shows a radar assembly comprising a plurality of radar modules, wherein a radar module may be similar to one illustrated in FIGS. 1 to 3, described hereinbefore. This assembly is an example with a matrix of 3×8=24 modules. A radar module operating at high frequencies, such as, for example 60 GHz, may be relatively small, for example in the order of millimeters to centimeters. Handling, alignment, etc of such a small radar module can be difficult in mass production. It is much easier to handle a matrix of radar modules, such as the one illustrated in FIG. 4, or even a matrix with 100 radar modules.

A production process can then be as follows. A PCB with a combined layout of 24 devices is produced. Subsequently, 24 radar ICs and 24 micro-processor ICs are glued to the PCB, and bond-wire connections to the PCB are made. This assembly is then encapsulated in a mold, and injection molded with epoxy. After curing of the epoxy, the assembly is sawn and the 24 devices are ready for shipment, individually.

Figure 5:
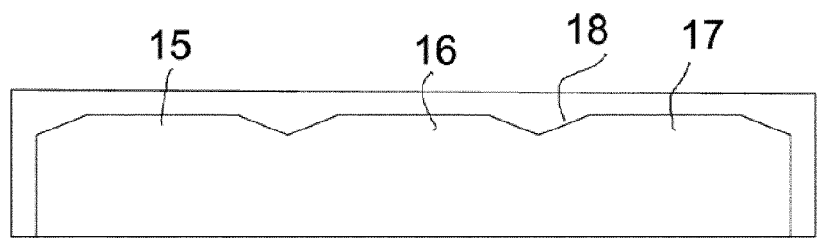
FIG. 5 illustrates a mold can be used for efficiently manufacturing radar modules.

FIG. 5 shows a cross-section of a mold that can be used for efficiently manufacturing radar modules, such as the one illustrated in FIG. 3. The mold is used to provide radar modules with a covering epoxy layer. The mold incorporates an inner top wall with protrusions 18 to produce the slanted edges illustrated in FIG. 3. In this example, the mold comprises 3 sections 15, 16, 17 that define 3 epoxy layer cover for 3 radar ICs. The mold has a form that is similar to a mold for producing chocolate bars.

In summary, what has been presented are embodiments of a radiofrequency module comprising an antenna assembly (4) on a semiconductor integrated circuit (3) that can transmit an electromagnetic signal in a frequency band of interest, or receive an electromagnetic signal in a frequency band of interest, or both. In the radiofrequency module, a conductive layer (8) that forms a signal ground plane. There is a dielectric spacing (d1, d2) between the antenna assembly (4) and the conductive layer (8) that forms the signal ground plane. At least one semiconductor layer (d1) of the semiconductor integrated circuit (3) forms part of this dielectric spacing (d1, d2). The dielectric spacing (d1, d2) is arranged so that an electromagnetic signal in the frequency band of interest that traverses through the dielectric spacing (d1, d2) from the antenna assembly (4) to the conductive layer (8) that forms the signal ground plane experiences a phase shift comprised in a range between 60 and 120 degrees.

NOTES

The detailed description hereinbefore with reference to the drawings is merely an illustration of the invention and the additional features, which are defined in the claims. The invention can be implemented in numerous different ways. In order to illustrate this, some alternatives are briefly indicated.

The invention may be applied to advantage in numerous types of products or methods related to transmitting or receiving electromagnetic signals, or both. Radar applications are merely an example. As another example, the invention may be applied to advantage in telecommunication devices.

The term "antenna assembly" should be understood in a broad sense. The term may embrace any arrangement that is capable of converting electromagnetic signal into an electrical signal, or vice versa. An antenna assembly on a semiconductor integrated circuit may be formed during a manufacturing process of the semiconductor integrated circuit. Alternatively, the antenna assembly may be disposed on an already manufactured semiconductor integrated circuit.

The term "dielectric spacing" should be understood in a broad sense. The term embraces a physical structure and composition of material that is present between the antenna assembly and the signal ground plane. In the embodiments presented in the detailed description and in the drawings, the dielectric spacing comprises a semiconductor layer and a printed circuit board. It should further be noted that the term "silicon", which has been used in the detailed description for reasons of convenience, does not exclude use of other semiconductor materials.

In general, there are numerous different ways of implementing the invention, whereby different implementations may have different topologies. In any given topology, a single module may carry out several functions, or several modules may jointly carry out a single function. In this respect, the drawings are very diagrammatic.

The remarks made hereinbefore demonstrate that the detailed description with reference to the drawings is an illustration of the invention rather than a limitation. The invention can be implemented in numerous alternative ways that are within the scope of the appended claims. All changes that come within the meaning and range of equivalency of the claims are to be embraced within their scope. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps. The mere fact that respective dependent claims define respective additional features, does not exclude combinations of additional features other than those reflected in the claims.

The invention claimed is:

1. A radiofrequency module comprising:
   an antenna assembly on a semiconductor integrated circuit arranged to carry out at least one of the following functions: transmitting an electromagnetic signal in a frequency band of interest, and receiving an electromagnetic signal in the frequency band of interest;
   a conductive layer that forms a signal ground plane; and
   a dielectric spacing between the antenna assembly and the conductive layer that forms the signal ground plane, the dielectric spacing comprising:
      at least one semiconductor layer of the semiconductor integrated circuit; and
      a printed circuit board on which the semiconductor integrated circuit is mounted, the conductive layer that forms the signal ground plane being disposed on a side of the printed circuit board opposite to a side on which the semiconductor integrated circuit is mounted,
   the dielectric spacing being arranged so that an electromagnetic signal in the frequency band of interest that traverses through the dielectric spacing from the antenna assembly to the conductive layer that forms the signal ground plane experiences a phase shift comprised in a range between 60 and 120 degrees.

2. A radiofrequency module according to claim 1, wherein the dielectric spacing has an effective dielectric thickness $d_{tot}/\lambda$. that can be expressed as:

$$\frac{d_{tot}}{\lambda} = \frac{d1}{\lambda}\sqrt{er1} + \frac{d2}{\lambda}\sqrt{er2}$$

d1 representing a thickness of the at least one semiconductor layer of the semiconductor integrated circuit;
   d2 representing a thickness of the printed circuit board;
   er1 representing a dielectric constant of the at least one semiconductor layer;
   er2 representing a dielectric constant of the printed circuit board; and
   $\lambda$ representing a free-space wavelength at a frequency in the frequency band of interest, whereby the thickness d1 and the thickness d2 are such that the effective electric thickness $d_{tot}/\lambda$ is comprised in a range between 0.22 and 0.28.

3. A radiofrequency module according to claim 1, wherein the printed circuit board comprises epoxy material.

4. A radiofrequency module according to claim 3, wherein the printed circuit board comprises a hydrocarbon ceramic laminate.

5. A radiofrequency module according to claim 1, wherein the printed circuit board comprises at least one conducting via arranged to electrically couple the semiconductor integrated circuit to the conductive layer that forms the signal ground plane.

6. A radiofrequency module according to claim 1, comprising a covering layer disposed on the antenna assembly.

7. A radiofrequency module according to claim 6, wherein the covering layer has a shape such that the covering layer constitutes an electromagnetic lens for an electromagnetic signal in the frequency band of interest.

8. A radiofrequency module according to claim 7, wherein the covering layer comprises slanted edges.

9. A radiofrequency module according to claim 6, wherein the covering layer comprises epoxy material.

10. A radiofrequency module according to claim 1, wherein the semiconductor integrated circuit is arranged to carry out radar detection.

11. A radiofrequency module according to claim 1, wherein the radiofrequency module is adapted for surface mounting on a printed circuit board.

* * * * *